US006930480B1

(12) United States Patent
Fujita et al.

(10) Patent No.: US 6,930,480 B1
(45) Date of Patent: Aug. 16, 2005

(54) HEAD COIL ARRAYS FOR PARALLEL IMAGING IN MAGNETIC RESONANCE IMAGING

(75) Inventors: Hiroyuki Fujita, Highland Heights, OH (US); Labros S. Petropoulos, Solon, OH (US); Mark Xueming Zou, Aurora, OH (US); Pei H. Chan, Aurora, OH (US); Dashen Chu, Hudson, OH (US); Joseph Murphy-Boesch, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/187,353

(22) Filed: Jun. 28, 2002

Related U.S. Application Data

(63) Continuation-in-part of application No. 10/164,664, filed on Jun. 7, 2002.

(60) Provisional application No. 60/302,158, filed on Jun. 29, 2001, provisional application No. 60/296,885, filed on Jun. 8, 2001.

(51) Int. Cl.$^7$ .............................................. G01V 3/00
(52) U.S. Cl. ..................................... 324/318; 324/309
(58) Field of Search ............................... 324/318, 309, 324/307, 322, 319; 600/422, 410

(56) References Cited

U.S. PATENT DOCUMENTS

| | | | |
|---|---|---|---|
| 4,825,162 A | 4/1989 | Roemer et al. | 324/318 |
| 5,198,768 A | 3/1993 | Keren | 324/318 |
| 5,430,378 A | 7/1995 | Jones | 324/309 |
| 5,477,146 A | 12/1995 | Jones | 324/318 |
| 5,548,218 A | 8/1996 | Lu | 324/309 |
| 5,602,479 A * | 2/1997 | Srinivasan et al. | 324/318 |
| 5,910,728 A | 6/1999 | Sodickson | 324/318 |
| 5,933,007 A * | 8/1999 | Schommer et al. | 324/318 |
| 6,169,401 B1 | 1/2001 | Fujita et al. | 324/318 |
| 6,236,203 B1 | 5/2001 | Shvartsman et al. | 324/318 |
| 6,501,274 B1 * | 12/2002 | Ledden | 324/318 |
| 6,577,888 B1 * | 6/2003 | Chan et al. | 600/422 |
| 6,680,610 B1 * | 1/2004 | Kyriakos et al. | 324/307 |
| 2003/0004410 A1 * | 1/2003 | Zhu | 600/422 |

OTHER PUBLICATIONS

Porter et al A 16-Element Phased-Array Head Coil MRM 40: 272-279, 1998.*
"Simultaneous Acquisition of Spatial Harmonics (SMASH): Fast Imaging with Radiofrequency Coil Arrays," Daniel K. Sodickson and Warren J. Manning, Magnetic Resonance in Medicine 38:591-603 (1997).

"SENSE: Sensitivity Encoding for Fast MRI," Klaas P. Pruessmann, et al., Magnetic Resonance in Medicine 42: 952-962 (1999).
"A multicoil array designed for cardiac SMASH imaging," Mark A. Griswold, et al., Magnetic Resonance Materials in Physics, Biology and Medicine 10 (2000) 105-113.
"SMASH imaging with an eight element multiplexed RF coil array," James A. Bankson, et al., Magnetic Resonance Materials in Physics, Biology and Medicine 10 (2000) 93-104.
"An array that exploits phase for SENSE imaging," Joseph V. Hajnal, et al., International Society for Magnetic Resonance in Medicine, 8$^{th}$ Scientific Meeting & Exhibition, Proceedings, 1719, (2000).
"A 4 channel head coil for SENSE imaging," D. J. Herlihy, et al., International Society for Magnetic Resonance in Medicine, 8$^{th}$ Scientific Meeting & Exhibition, Proceedings, 1394, (2000).
"Planar Strip Array (PSA) for MRI," Ray F. Lee, et al., Magnetic Resonance in Medicine 45:673-683 (2001).
"Concentric Coil Arrays for Spatial Encoding in Parallel MRI," Michael A. Ohliger, et al., International Society for Magnetic Resonance in Medicine, 9$^{th}$ Scientific Meeting & Exhibition, Proceedings, 21, (2001).
"Specific Coil Design for SENSE: A Six-Element Cardiac Array," Markus Weiger, et al., Magnetic Resonance in Medicine 45:495-504 (2001).
"SMASH and Sense: Experimental and Numerical Comparisons," Bruno Madore and Norbert J. Pelc, Magnetic Resonance in Medicine 45:1103-1111 (2001).
"An efficent, highly homogeneous radiofrequency coil for whole-body NMR imaginingg at 1.5T," Cecil E. Hayes, et al., Journal of Magnetic Resonance 63:622-628 (1985).
"A Four Channel Transceive Phased Array Head Coil for 3T," Scott B. King et al., International Society for Magnetic Resonance in Medicine, 9$^{th}$ Scientific Meeting & Exhibition, Proceedings, 12, (2001).

* cited by examiner

*Primary Examiner*—Brij B. Shrivastav
(74) *Attorney, Agent, or Firm*—Michael A. Della Penna; Armstrong Teasdale LLP

(57) ABSTRACT

A partially parallel acquisition RF coil array for imaging a human head includes at least a first, a second and a third loop coil adapted to be arranged circumambiently about the lower portion of the head; and at least a forth, a fifth and a sixth coil adapted to be conformably arranged about the summit of the head. A partially parallel acquisition RF coil array for imaging a human head includes at least a first, a second, a third and a fourth loop coil adapted to be arranged circumambiently about the lower portion of the head; and at least a first and a second Figure-8 or saddle coil adapted to be conformably arranged about the summit of the head.

20 Claims, 9 Drawing Sheets

Elevation

Elevation

Anterior

Posterior

HEAD COIL ARRAYS FOR PARALLEL IMAGING IN MAGNETIC RESONANCE IMAGING

CROSS-REFERENCE TO RELATED APPLICATION

This application claims the benefit of U.S. provisional patent applications Ser. No. 60/302,158 filed Jun. 29, 2001 and Ser. No. 60/296,885 filed Jun. 8, 2001.

This application is a continuation-in-part of U.S. utility patent application Ser. No. 10/164,664 filed Jun. 7, 2002.

BACKGROUND OF THE INVENTION

The present invention relates to magnetic resonance imaging (MRI) systems, and particularly to the radio frequency (RF) coils used in such systems.

Magnetic resonance imaging (MRI) utilizes hydrogen nuclear spins of the water molecules in the human body or other tissue, which are polarized by a strong, uniform, static magnetic field generated by a magnet (referred to as $B_0$—the main magnetic field in MRI physics). The magnetically polarized nuclear spins generate magnetic moments in the human body. The magnetic moments point in the direction of the main magnetic field in a steady state, and produce no useful information if they are not disturbed by any excitation.

The generation of nuclear magnetic resonance (NMR) signal for MRI data acquisition is achieved by exciting the magnetic moments with a uniform radio frequency (RF) magnetic field (referred to as the $B_1$ field or the excitation field). The $B_1$ field is produced in the imaging region of interest by an RF transmit coil which is driven by a computer-controlled RF transmitter with a power amplifier. During the excitation, the nuclear spin system absorbs magnetic energy, and its magnetic moments precess around the direction of the main magnetic field. After the excitation, the precessing magnetic moments will go through a process of free induction decay, emitting their absorbed energy and then returning to the steady state. During the free induction decay, NMR signals are detected by the use of a receive RF coil, which is placed in the vicinity of the excited volume of the human body. The NMR signal is an induced electrical motive force (voltage), or current, in the receive RF coil that has been induced by the flux change over some time period due to the relaxation of precessing magnetic moments in the human tissue. This signal provides the contrast information of the image. The receive RF coil can be either the transmit coil itself, or an independent receive-only RF coil. The NMR signal is used for producing magnetic resonance images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the same direction of the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (S/N) if it is also used for reception, mainly because of its greater distance from the signal-generating tissues being imaged. Since a high signal-to-noise ratio is the most desirable factor in MRI, special-purpose coils are used for reception to enhance the S/N ratio from the volume of interest.

In practice, a well-designed specialty RF coil should have the following functional properties: high S/N ratio, good uniformity, high unloaded quality factor (O) of the resonance circuit, and high ratio of the unloaded to loaded Q factors. In addition, the coil device must be mechanically designed to facilitate patient handling and comfort, and to provide a protective barrier between the patient and the RF electronics. Another way to increase the S/N is by quadrature reception. In this method, NMR signals are detected in two orthogonal directions, which are in the transverse plane or perpendicular to the main magnetic field. The two signals are detected by two independent individual coils which cover the same volume of interest. With quadrature reception, the S/N can be increased by up to $\sqrt{2}$ over that of the individual linear coils.

To cover a large field-of-view, while maintaining the S/N characteristic of a small and conformal coil, a linear surface coil array technique was created to image the entire human spines (U.S. Pat. No. 4,825,162). Subsequently, other linear surface array coils were used for C.L. spine imaging, such as the technique described in U.S. Pat. No. 5,198,768. These two devices consist of an array of planar linear surface coil-elements. These coil systems do not work well for imaging deep tissues, such as the blood vessels in the lower abdomen, due to sensitivity drop-off away from the coil surface.

To image the lower extremities, quadrature phased array coils have been utilized such as described in U.S. Pat. Nos. 5,430,378 and 5,548,218. The first quadrature phased array coil, images the lower extremities by using two orthogonal linear coil arrays: six planar loop coil elements placed in the horizontal plane and underneath the patient and six planar loop coil elements placed in the vertical plane and in between the legs. Each linear coil array functions in a similar way as described in U.S. Pat. No. 4,825,162 (Roemer). The second quadrature phased array coil (Lu) was designed to image the blood vessels from the pelvis down. This device also consists of two orthogonal linear coil arrays extending in the head-to-toe direction: a planar array of loop coil elements laterally centrally located on top of the second array of butterfly coil elements. The loop coils are placed immediately underneath the patient and the butterfly coils are wrapped around the patient. Again, each linear coil array functions in a similar way as described in U.S. Pat. No. 4,825,162.

In MRI, gradient coils are routinely used to give phase-encoding information to a sample to be imaged. To obtain an image, it is required that all the data points in a so-called "k-space" (i.e., frequency space) must be collected. Recently, there have been developments where some of the data points in k-space are intentionally skipped and at the same time use the intrinsic sensitivity information of RF receive coils as the phase-encoding information for those skipped data points. This action takes place simultaneously, and thus is referred to as partially parallel imaging or partially parallel acquisition (PPA). By collecting multiple data points simultaneously, it requires less time to acquire the same amount of data, when compared with the conventional gradient-only phase-encoding approach. The time savings can be used to reduce total imaging time, in particular, for the applications in which cardiac or respiratory motions in tissues being imaged become concerns, or to collect more data to achieve better resolution or S/N. SiMultaneous Acquisition of Spatial Harmonics, SMASH, (U.S. Pat. No. 5,910,728 and "Simultaneous Acquisition of Spatial Harmonics (SMASH): Fast Imaging with Radiofrequency Coil Arrays," Daniel K. Sodickson and Warren J. Manning, Magnetic Resonance in Medicine 38:591–603 (1997), both incorporated herein by reference) and "SENSE: Sensitivity Encoding for Fast MRI," Klaas P. Pruessmann, et al., Magnetic Resonance in Medicine 42:952–962 (1999, also incorporated by reference, are basically two methods of PPA. SMASH takes advantage of the parallel imaging by skipping phase encode lines that yield decreasing the Field-of-View (FOV) in the phase-encoding direction and uses coils (e.g., coil arrays) together with reconstruction techniques to fill in the missing data points in k-space. SENSE, on the other hand, is a technique that utilizes a reduced FOV in the read direction, resulting an aliased image that is then unfolded in x-space (i.e., real space), while using the RF coil sensitivity information, to obtain a true corresponding image. Here, we make use of phase difference between signals from multiple coils to skip phase encoding steps. By skipping some of the phase encoding steps, one can achieve speeding up imaging process by a reduction factor R. Theoretically speaking, the factor R should equal the number of independent coils/arrays. In the SENSE approach, the SIR is defined as:

$$SNR_{SENSE} = SNR_{FULL} / \{g_v \sqrt{R}\}$$

where $SNR_{FULL}$ is the S/N achievable when all the phase encoding steps are collected by traditional gradient phase encoding scheme. $SNR_{SENSE}$ is optimized when the geometry factor g equals 1. To obtain g of 1, traditional decoupling techniques such as overlapping nearest neighbor elements to null the mutual inductance between them shall not apply, as have been reported by others.

SENSE and SMASH or a hybrid approach of both demand a new type of design requirements in RF coil design. In SMASH, the primary criterion for the array is that it be capable of generating sinusoids whose wavelengths are on the order of the FOV. This is how the target FOV along the phase encoding direction for the array is determined. Conventional array designs can incorporate element and array dimensions that will give optimal S/N for the object of interest. In addition, users of conventional arrays are free to choose practically any FOV, as long as severe aliasing artifacts are not a problem. In contrast, when using SMASH, the size of the array determines the approximate range of FOVs that can be used in the imaging experiment. This then determines the approximate element dimensions, assuming complete coverage of the FOV is desired, as in most cases. In SENSE, the method is based upon the fact that the sensitivity of a RF receiver coil generally has a phase-encoding effect complementary to those achieved by linear field gradients. For SENSE imaging, the elements of a coil array should be smaller than for common phased-array imaging, resulting in a trade-off between basic noise and geometry factor, and adjacent coil elements should not overlap for a net gain in S/N due to the improved geometry factor when using SENSE.

For PPA applications, different types of RF coils or arrays have been used so far. However, most of them are based upon "traditional" RF coil design requirements, thus remain within the conventional coil design scheme. It has been reported, however, that since the phase information of $B_1$ of a receive coil is very important when SENSE applications are demanded, for example, new coil design techniques such as non-overlapping adjacent coil elements may be necessary for better definition of the individual phase information associated with each RF coil used in an array, unlike traditional design scheme where two adjacent coils elements are overlapped to null the mutual inductance between the elements (U.S. Pat. No. 4,825,162). Without overlap, the coupling may be increased, but there is a net gain in S/N due to the improved geometry factor when using SENSE. As stated in the above, the use of smaller coil-elements than those for conventional imaging results in a trade-off between basic noise and geometry factor.

SUMMARY OF THE INVENTION

A partially parallel acquisition RF coil array for imaging a human head includes at least a first, a second and a third loop coil adapted to be arranged circumambiently about the lower portion of the head; and at least a forth, a fifth and a sixth coil adapted to be conformably arranged about the summit of the head.

A partially parallel acquisition RF coil array for imaging a human head includes at least a first, a second, a third and a fourth loop coil adapted to be arranged circumambiently about the lower portion of the head; and at least a first and a second Figure 8 or saddle coil adapted to be conformably arranged about the summit of the head.

DESCRIPTION OF THE PREFERRED EMBODIMENTS

As is seen from the equation above, we loose S/N intrinsically when we try to reduce the imaging time. Thus, to compensate for S/N loss, we design the size of each element smaller than that of conventional array elements. We also increase the total number of elements to cover the volume of interest (which may be constrained by the maximum available number of receiver channels).

The present invention provides an improved and advanced volume and surface coil array that covers a large field-of-view while providing greater S/N and can be used as a PPA targeted coil for imaging a large volume such as head, abdomen or heart.

The present invention may also employ various combinations of coils distributed not only in circumambient directions but also in the z direction and provide better S/N for the torso and cardiac imaging as compared with a conventional torso/cardiac coil.

The basic building blocks of the present invention are the well-known coil configurations of FIGS. 1 through 6.

Figure 1:
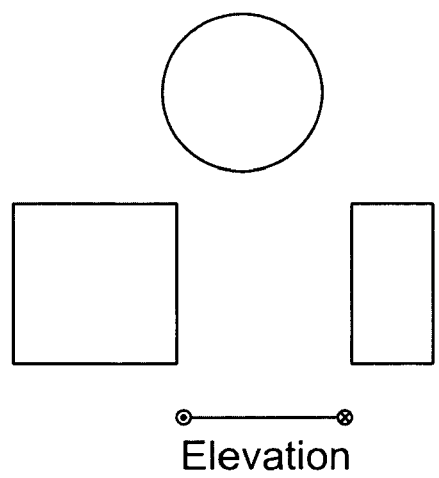
FIG. 1 is plan and elevation views of a schematic diagram of exemplary circular, rectangular or arbitrary-shaped loop coils.

FIG. 1 shows a circular, a rectangular and an arbitrary-shaped loop. These elements produce a useful $B_1$ field normal to the plane defined by the elements.

Figure 2:
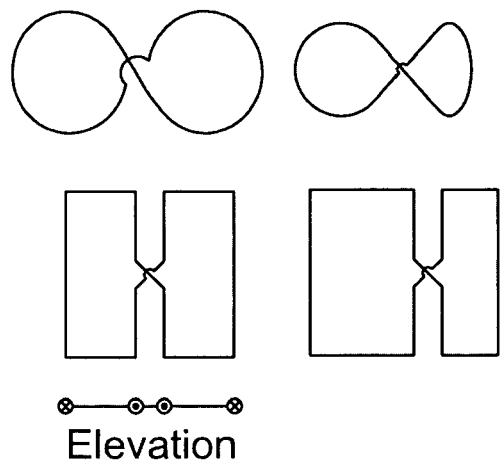
FIG. 2 is plan and elevation views of a schematic diagram of exemplary saddle/"Figure 8" coils.
Figure 8:
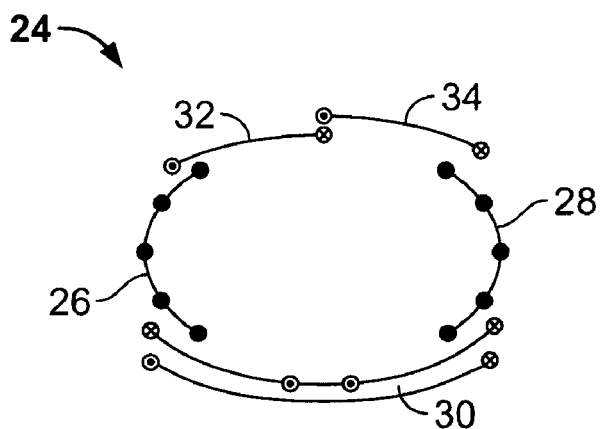
FIG. 8 is an elevation view of a schematic diagram of a second exemplary coil array according to the invention.

FIG. 2 shows a so-called "Figure-8", a symmetric/asymmetric saddle, and an arbitrary-shaped crossed coil. They can be placed flat or conformed to some curvature. These elements produce a useful $B_1$ field parallel to the plane defined by the elements.

Figure 3:
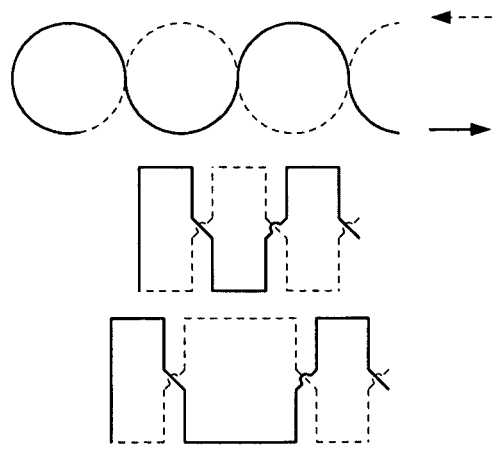
FIG. 3 is plan views of a schematic diagram of exemplary saddle-train and "Figure 8"-train coils.

FIG. 3 shows a so-called "Figure-8" train, a symmetric/asymmetric saddle train, and an arbitrary-shaped crossed coil train. They can be placed flat or conformed to some curvature. These elements produce a useful $B_1$ field parallel to the plane defined by the elements.

Figure 4:
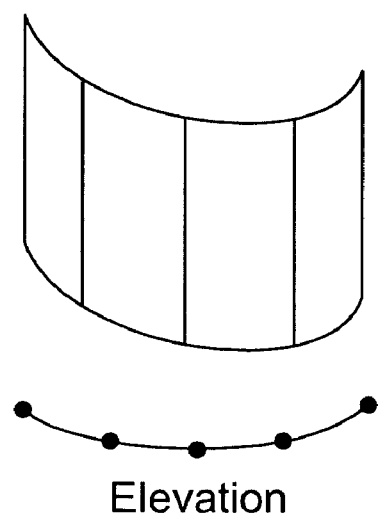
FIG. 4 is perspective and elevation views of a schematic diagram of an exemplary ladder multi-mode coil or half-bird cage coil.

FIG. 4 shows a "ladder" coil or a "half-birdcage" coil if curved around a volume of interest. The element has multiple resonant modes. For example, by exciting appropriate modes of the element, this coil can generate both a $B_1$ field normal to and a $B_1$ field parallel to the plane defined by the coil at the same imaging frequency. Other modes may be excited depending upon the application of interest.

Figure 5:
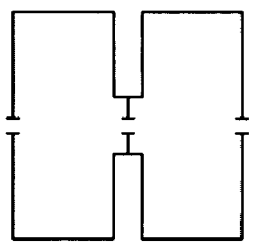
FIG. 5 is a plan view of a schematic diagram of an exemplary "H" multi-mode coil.

FIG. 5 shows a so-called "H" coil and is also a multimode coil.

Figure 6A:
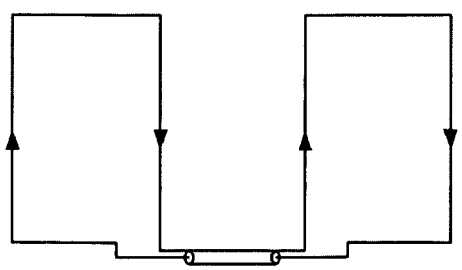
FIG. 6 is plan views of a schematic diagram of exemplary mode-controlled loop pair coils (MCLP coils) (connection between two loops can be a rigid/flexible coaxial cable, balanced transmission line type of cable such as 300 ohm TV cable, or can be etched strip line transmission lines with high characteristic impedance, greater or equal to 50 ohms, for example)

FIG. 6a shows an A-type mode-controlled loop pair coil (MCLP coil). The $B_1$ magnetic field polarization depends upon how the cable is connected to the coils.

Figure 6B:
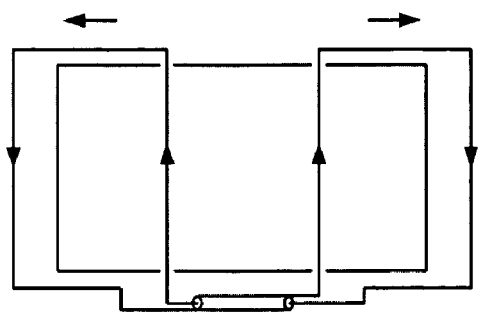

FIG. 6b shows a B-type mode-controlled loop pair coil (MCLP coil) shown in solid lines. The B-type MCLP coil is shown with a loop coil in phantom lines, constituting a quadrature coil. Thus, the B-type MCLP coil functions as a well known "Figure 8" or saddle coil.

Figure 6C:
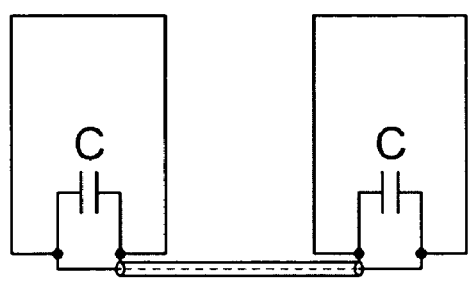

FIG. 6c shows an AB-type mode-controlled loop pair coil (MCLP coil). The AB-type MCLP coil is independent of cable connection (polarity). For this to function, the cable becomes high capacitance (relative to 50 ohms; large capacitance=comparable or greater than 50 ohms; small capacitance=much less than 50 ohms, e.g., 20 ohms).

Figure 6D:
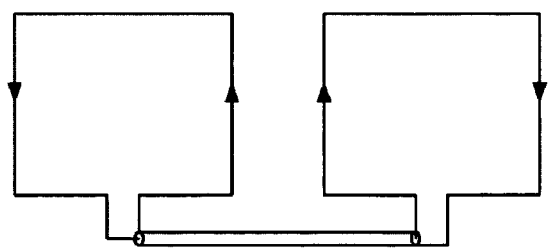
Figure 6D:
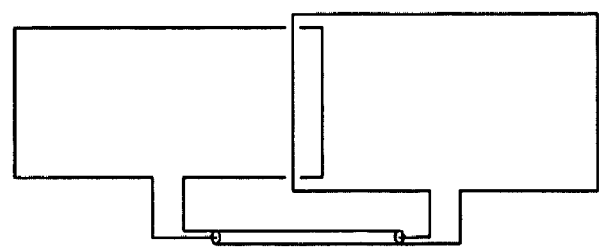

FIG. 6d shows a mode-controlled loop pair coil (MCLP coil). By adjusting the cable length, the overlap area can be controlled. This MCLP coil functions as a "Figure-8" or saddle coil.

These coil configurations are combined into an array of smaller and more numerous coils than was contemplated in the past.

Figure 7:
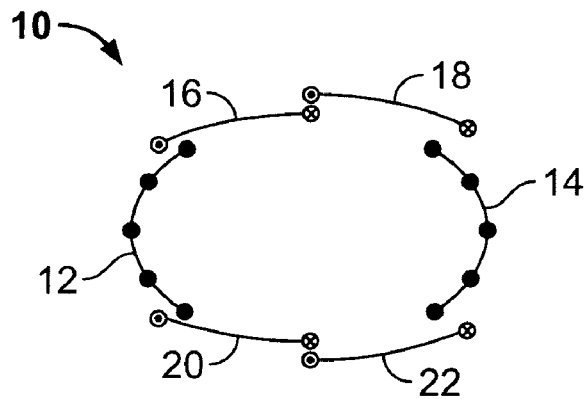
FIG. 7 is an elevation view of a schematic diagram of a first exemplary coil array according to the invention.

Referring to FIG. 7, this is a coil array 10 where combinations of quadrature ladder/half-birdcage coils 12, 14 are used together with loops coils 16, 18, 20, 22 whose sizes are optimized for S/N. The quadrature ladder/half-birdcage coil sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Referring to FIG. 8, this is a coil array 24 where combinations of different type of quadrature coils (i.e., ladder/half-birdcage coils 26, 28, a loop-and-butterfly quadrature coil 30 are used for giving distinct phase information together with loop coils 32, 34 whose sizes are optimized for PPA applications and S/N. The ladder/half-birdcage sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 9:
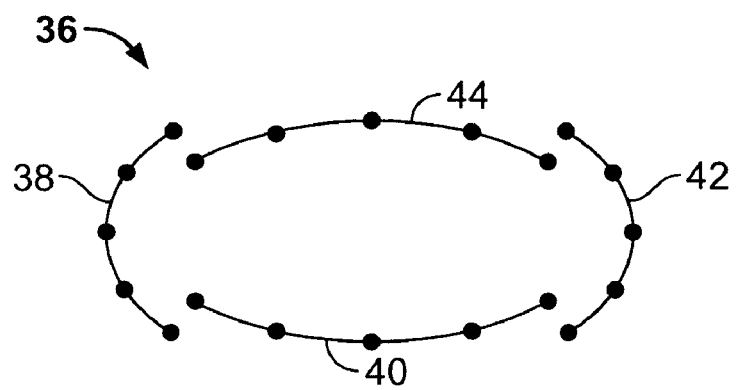
FIG. 9 is an elevation view of a schematic diagram of a third exemplary coil array according to the invention.

Referring to FIG. 9, this is a coil array 36 where combinations of quadrature ladder/half-birdcage coils 38, 40, 42, 44 are used. The quadrature ladder/half-birdcage sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in SNR due to the improved geometry factor when using SENSE.

Figure 10:
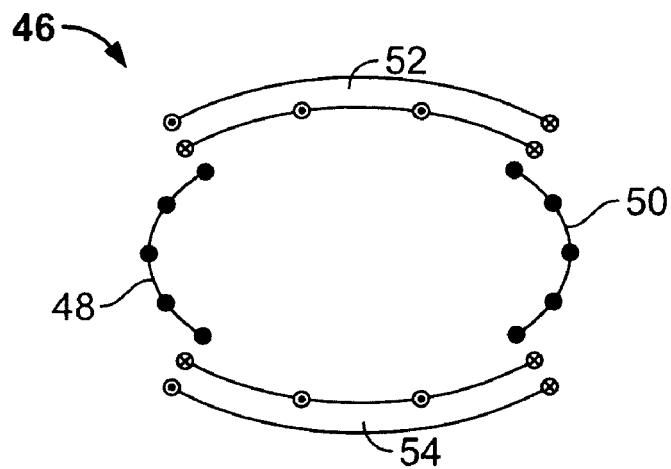
FIG. 10 is an elevation view of a schematic diagram of a fourth exemplary coil array according to the invention.

Referring to FIG. 10, this is a coil array 46 where combinations of quadrature ladder/half-birdcage coils 48, 50 are used together with another type of quadrature coils, namely, a combination of a loop and a butterfly coils 52, 54. The quadrature ladder/half-birdcage coils may be replaced by "H" coils or a combination of loop and "Figure 8" (saddle) coils. The sizes of the loop and the butterfly coils are chosen such that B1 field penetrates deep enough so as to tissues at the center region can be imaged with high S/N. This applies to the quadrature ladder/half-birdcage sections. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 11:
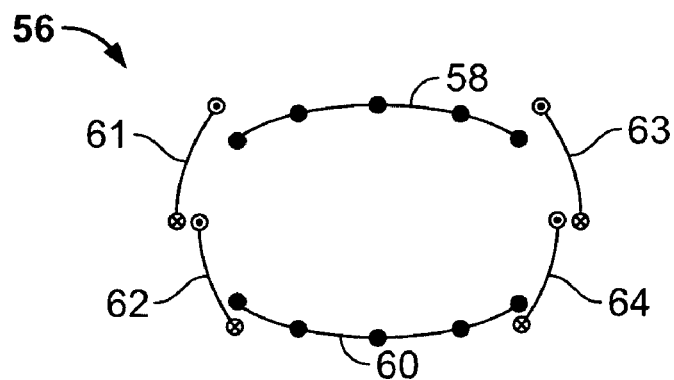
FIG. 11 is an elevation view of a schematic diagram of a fifth exemplary coil array according to the invention.

Referring to FIG. 11, this is a coil array 56 where combinations of quadrature ladder/half-birdcage coils 58, 60 are used together with loop coils 61, 62, 63, 64. The quadrature ladder/half-birdcage sections may be replaced by "H" coils or a combination of loop and "Figure 8" (saddle) coils. The sizes of the loop coils are optimized for S/N. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 12:
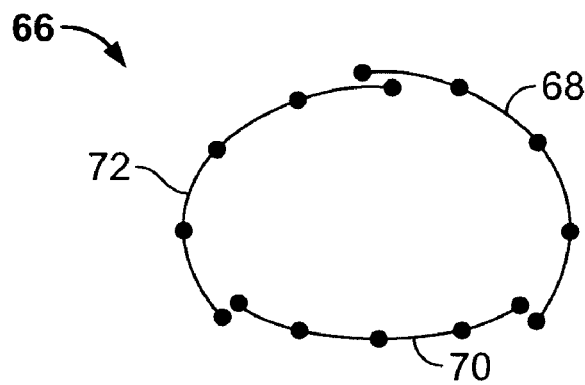
FIG. 12 is an elevation view of a schematic diagram of a sixth exemplary coil array according to the invention.
Figure 13:
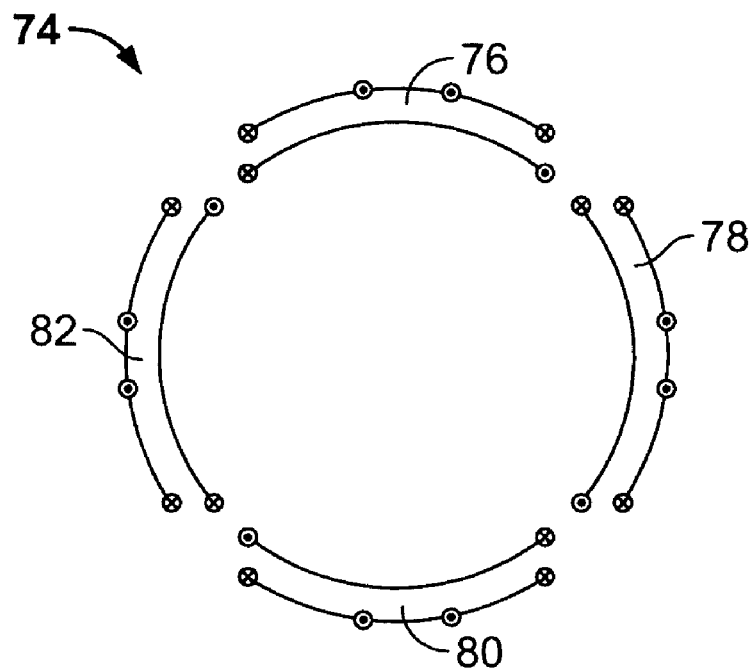
FIG. 13 is an elevation view of a schematic diagram of a seventh exemplary coil array according to the invention.

Referring to FIG. 12, this is a coil array 66 where combinations of quadrature ladder/half-birdcage coils 68, 70, 72 are used, each having different curvature and size for optimized S/N. The quadrature ladder/half-birdcage sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

referring to FIG. 13, this is a coil array 74 where combinations of quadrature coils 76, 78, 80, 82 are used. A configuration where adjacent coils are not overlapped is shown since this non-overlapping configuration yields better phase definition associated with each coil. A low-input impedance preamplifier decoupling technique ensures adequate decoupling of neighboring coils (i.e., mutual inductance between adjacent coils are minimized). Traditional decoupling technique such as overlapping adjacent coils is possible, too. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 14:
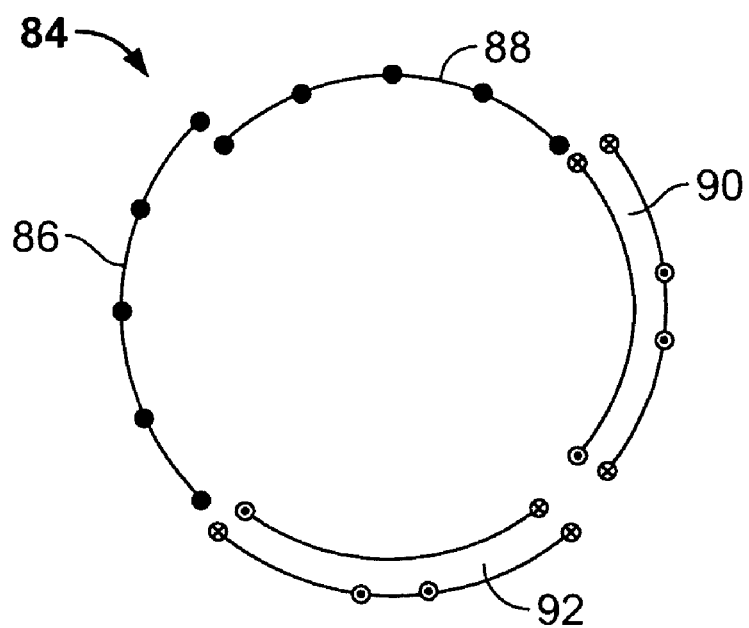
FIG. 14 is an elevation view of a schematic diagram of an eighth exemplary coil array according to the invention.

Referring to FIG. 14, this is a coil array 84 where combinations of quadrature coils 86, 88, 90, 92 are used. The ladder/half-birdcage sections 86, 88 may be replaced for example, by "H" coils or a combination of loop and "Figure 8" (saddle) coils. A configuration where adjacent coils are not overlapped is shown since this non-overlapping configuration yields better phase definition associated with each coil. A low-input impedance preamplifier decoupling technique ensures adequate decoupling of neighboring coils (i.e., mutual inductance between adjacent coils are minimized). Traditional decoupling technique such as overlapping adjacent coils is possible, too. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 15:
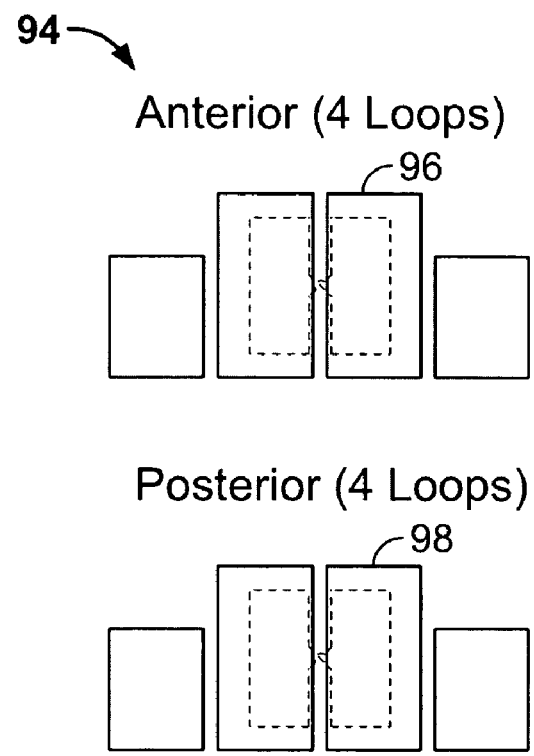
FIG. 15 is a plan view of a schematic diagram of a ninth exemplary coil array according to the invention.

Referring to FIG. 15, this a coil array 94 for torso imaging. Anterior part 96 and posterior part 98 are made of differently sized loops for the optimized S/N. They may be flat or curved. Loops shown in solid lines are positioned to optimize imaging of a region of interest, and they may be overlapped for improved decoupling between adjacent loops or non-overlapped for a net gain in S/N due to the improved geometry factor when using SENSE. Shown in dashed lines are saddle or "Figure-8", coils. When they are placed on top of the loops as shown in FIG. 14, improvement in S/R is achieved.

Figure 16:
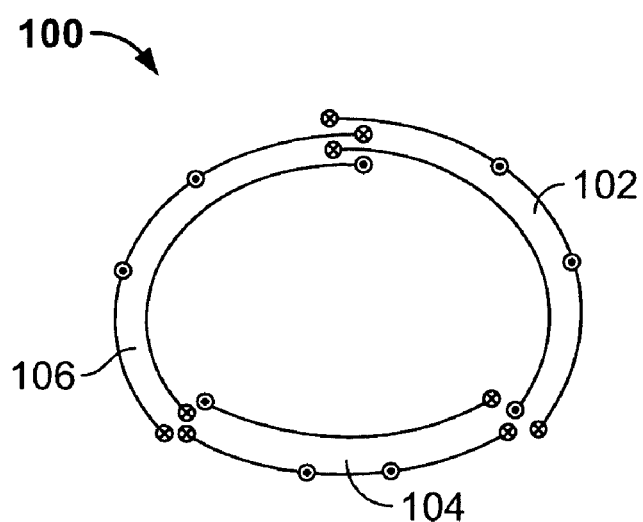
FIG. 16 is an elevation view of a schematic diagram of a tenth exemplary coil array according to the invention.

Referring to FIG. 16, this is a coil array 100 where combinations of three quadrature coils 102, 104, 106 (i.e., a loop coil and a butterfly/saddle/"Figure-8" coil) are used, each having different curvature and size for optimized S/N. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 17:
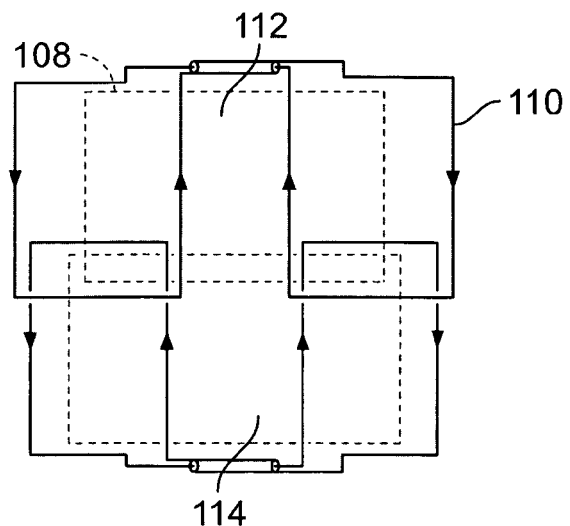
FIG. 17 is a plan view of a schematic diagram of an eleventh exemplary coil array according to the invention.

Referring to FIG. 17, a loop coil 108 in dashed lines and an MCLP coil 110 shown in black constitute a quadrature coil 112 since the MCLP coil functions as a "Figure 8" or saddle coil. The cables connecting two loops to form an MCLP coil can be 75 ohms or 50 ohms. Another pair of the loop-MCLP quadrature coil 114 is distributed in the z direction to cover a large FOV. The loop-MCLP quadrature coil can be distributed around a human body not only in a circumambient direction (m=1, 2, 3, 4 . . . ) but also in the z direction (n=1, 2, 3, 4 . . . ).

Figure 18:
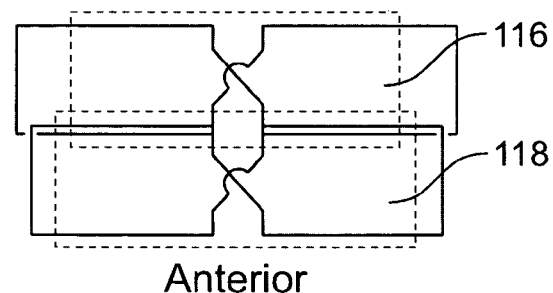
FIG. 18 is a plan view of a schematic diagram of a twelfth exemplary coil array according to the invention.
Figure 18:
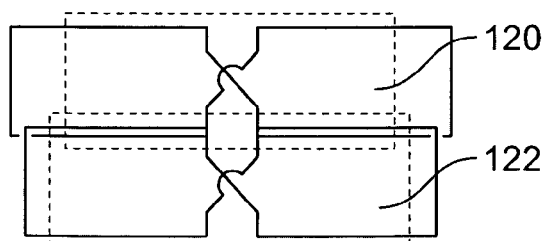

Referring to FIG. 18,: Two pairs of loop-saddle quadrature coils 116, 118 are distributed in the z direction to form an anterior coil, and another two pairs of the loop-saddle quadrature coils 120, 122 are placed on a posterior coil. The "Figure-8" or saddle coils can be replaced by MCLP coils.

Figure 19:
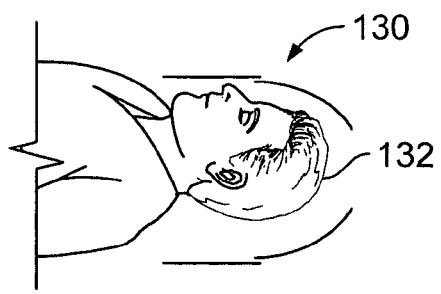
FIG. 19 is a side elevation view of a schematic diagram of an exemplary head coil array according to the invention.
Figure 20:
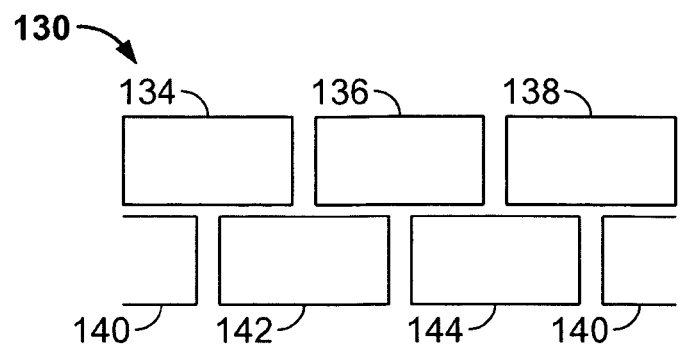
FIG. 20 is a schematic view of the coil array of FIG. 19 unwrapped on a plane.

Referring to FIGS. 19 and 20, this is a coil array 130 for imaging a human head 132. Three loop coils 134, 136, 138 are wrapped around the upper part of the head 132 while conforming to the summit of the head (i.e., a dome-like structure) for improving S/N. Another three loop coils 140, 142, 144 are circumambiently wrapped around the lower part of the head. This results in a six-channel PPA coil array.

FIG. 20 shows the coil array 130 projected on a plane (it should be understood that the left and right sides are actually joined to form a cylindrical/domed structure). The coils 134, 136, 138 are staggered sixty degrees with respect to the coils 140, 142, 144.

A configuration where adjacent coils are not overlapped is shown, and overlapping is not necessary when a low-input impedance amplifier decoupling technique is employed, for instance. In parallel imaging modality, the elements of a coil array should be smaller than for common phased-array imaging, resulting in a trade-off between the basic noise and geometry factor. The non-overlapping configuration may yield a net gain in S/N due to the improved geometry factor when using SENSE.

Figure 21:
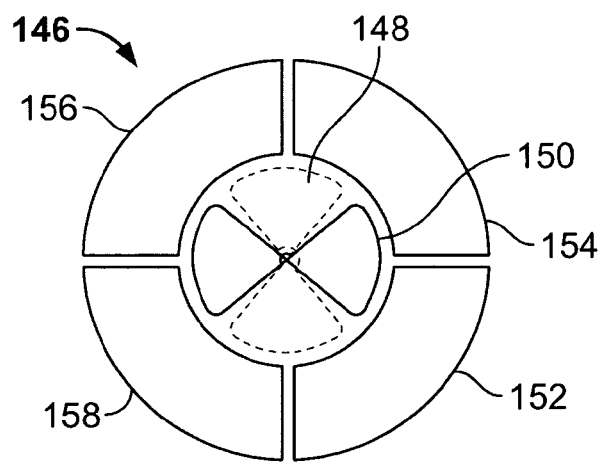
FIG. 21 is a top view of another exemplary head coil array according to the invention unwrapped on a plane.

Referring to FIG. 21, this is a coil array 146 for imaging a human head. Figure-8 coils 148, 150 are wrapped around the upper part of the head (i.e, a dome-like structure). Four loop coils 152, 154, 156, 158 are circumambiently wrapped around the lower part of the head. The coils 148, 150 are staggered 45 degrees with respect to the coils 152, 154, 156, 158. The neighboring elements may be overlapped. Here, a configuration where adjacent coils are not overlapped is shown. Overlapping is not necessary for decoupling when a low-input impedance amplifier decoupling technique is employed, for instance. In parallel imaging modality, the elements of a coil array should be smaller than for common phased-array imaging, resulting in a trade-off between the basic noise and geometry factor. The non-overlapping configuration may yield a net gain in S/N due to the improved geometry factor when using SENSE.

Figure 22:
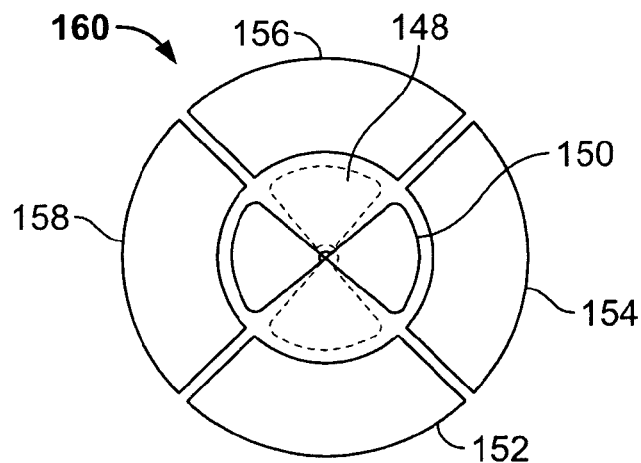
FIG. 22 is a top view of still another exemplary head coil array according to the invention unwrapped on a plane.

Referring to FIG. 22, this is a coil array 160 for imaging a human head. It is similar to the coil array 146, except that the coils 148, 150 are not staggered with respect to the coils 152, 154, 156, 158.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. An RF coil array for partially parallel acquisition for imaging a human head having a summit and a lower portion, said array comprising: at least a first, a second and a third loop coil adapted to be arranged circumambiently about said lower portion of said head; and at least a fourth, a fifth and a sixth coil adapted to be conformably arranged about said summit of said head, wherein each of said fourth, fifth, and sixth coils are physically separate from each of the other of said fourth, fifth, and sixth coils.

2. An array according to claim 1, wherein said fourth, said fifth and said sixth coils are loop coils.

3. An array according to claim 1, wherein said first, said second and said third coils are staggered by 60 degrees with respect to said fourth, said fifth and said sixth coils.

4. An array according to claim 1, wherein said fourth, fifth and sixth coils are configured in a dome shaped arrangement.

5. An array according to claim 1, wherein said first, second and third coils are configured in a cylindrically shaped arrangement.

6. An array according to claim 1, wherein at least two of said coils are overlapping.

7. An array according to claim 1, wherein at least two of said coils are non-overlapping.

8. An array according to claim 1, wherein said fourth, fifth and sixth coils are configured to be curved around said head.

9. A partially parallel acquisition RF coil array for imaging a human head having a summit and a lower portion, said array comprising: a first plurality of coils including at least a first, a second, a third and a fourth loop coil adapted to be arranged circumambiently about said lower portion of said head; and a second plurality of coils including at least a first and a second Figure-8 or saddle coil adapted to be conformably arranged about said summit of said head, wherein said coils within the second plurality are physically separate from said coils within the first plurality.

10. An array according to claim 9, wherein said first, said second, said third and said fourth coils are staggered by 45 degrees with respect to said first and said second Figure-8 or saddle coils.

11. An array according to claim 9, wherein said first, said second, said third and said fourth coils are aligned with respect to said first and said second Figure-8 or saddle coils.

12. An RF coil arrangement for parallel imaging comprising:
a first plurality of coils positioned at a first portion forming part of a coil array, said first plurality of coils forming a generally dome-shaped arrangement; and
a second plurality of coils positioned at a second portion forming part of the coil array, said second plurality of coils configured in a circumambient arrangement, said first and second portions aligned along an axis, and said coils within the second plurality are physically separate from said coils within the first plurality, and said RF coil arrangement is configured to image a head.

13. An RF coil arrangement according to claim 12, wherein said first plurality of coils form a generally semi-spherical arrangement.

14. An RF coil arrangement according to claim 12, wherein said coils comprise loop coils.

15. An RF coil arrangement according to claim 12, wherein said coils comprise at least one Figure-8 coil.

16. An RF coil arrangement according to claim 12, wherein said coil array is configured for imaging a human head, said first portion configured to be positioned adjacent a top of the human head and said second portion configured to be positioned adjacent and below the top of the human head.

17. An RF coil arrangement according to claim 12, wherein said first plurality of coils are configured to be offset relative to said second plurality of coils along the axis.

18. An RF coil arrangement according to claim 12, wherein said first plurality of coils are configured to be aligned relative to said second plurality of coils along the axis.

19. A method for parallel imaging comprising:
arranging a first plurality of coils in a generally dome-shaped configuration; and
arranging a second plurality of coils in a generally circumambient configuration, said first plurality of coils positioned at a first portion forming part of a coil array, said second plurality of coils positioned at a second portion forming part of the coil array, said first and second portions aligned along an axis, said coils within the second plurality are physically separate from said coils within the first plurality, and the coil array is configured to image a head.

20. A method according to claim 19 wherein said head comprises a human head, said first portion configured to be positioned adjacent a top of the human head and said second portion configured to be positioned adjacent and below the top of the human head.

* * * * *